(12) United States Patent
Ronesova et al.

(10) Patent No.: US 7,480,155 B2
(45) Date of Patent: Jan. 20, 2009

(54) DIGITAL GENERATOR OF PHASE SHIFT MODULATION

(75) Inventors: Andrea Ronesova, Plzen (CZ); Bohuslav Masek, Kaznejov (CZ)

(73) Assignee: University of West Bohemia, Plzen (CZ)

( * ) Notice: Subject to any disclaimer, the term of this patent is extended or adjusted under 35 U.S.C. 154(b) by 0 days.

(21) Appl. No.: 11/955,222

(22) Filed: Dec. 12, 2007

(65) Prior Publication Data

US 2008/0151990 A1 Jun. 26, 2008

(51) Int. Cl.
*H02M 3/335* (2006.01)
*H02M 7/44* (2006.01)

(52) U.S. Cl. .............................. 363/17; 363/98; 363/132

(58) Field of Classification Search .................... 363/17, 363/98, 132

See application file for complete search history.

(56) References Cited

U.S. PATENT DOCUMENTS

| | | | | |
|---|---|---|---|---|
| 5,198,971 A | * | 3/1993 | Recker et al. ................. | 363/71 |
| 5,590,033 A | * | 12/1996 | Kawano ....................... | 363/25 |
| 6,009,007 A | * | 12/1999 | Pan ............................. | 363/98 |
| 6,088,245 A | * | 7/2000 | Ainsworth .................... | 363/39 |
| 6,853,570 B2 | * | 2/2005 | De Vries ...................... | 363/131 |
| 2001/0033504 A1 | * | 10/2001 | Galbiati et al. ................ | 363/98 |

* cited by examiner

*Primary Examiner*—Bao Q Vu
(74) *Attorney, Agent, or Firm*—Hovey Williams LLP

(57) ABSTRACT

A digital generator of phase shift modulation receives two binary coded numbers (F) and (P), that represent a requested frequency value and a requested phase value, respectively, and generates two pairs of phase-shifted signals a, b and c, d. One pair of the phase-shifted signals is intended to control one half bridge of a full-bridge converter, and the second pair is intended to control the other half bridge. Signal b is complementary to signal a having a 50% duty cycle with addition of dead times created by a first delay line (5). Signals c and d have the same parameters as signals a and b, with the exception that dead times are created by a second delay line (6). The frequency of generated signals is proportional to the requested frequency value (F) and the phase shift between pairs of signals is proportional to the requested phase value (P).

10 Claims, 2 Drawing Sheets

DIGITAL GENERATOR OF PHASE SHIFT MODULATION

BACKGROUND OF THE INVENTION

1. Field of the Invention

The invention generally pertains to electronic power conversion circuits. More particularly, the invention relates to a device for generating phase shift modulation for full-bridge converters, such as resonant converters.

2. Description of the Prior Art

Phase shift modulation is an alternative to pulse width modulation (PWM) for controlling full-bridge converters. PWM is a well-known control method widely used in power converters for many decades, therefore many PWM control circuits exist. Because phase shift modulation is quite new, however, there are only a few integrated circuits for generating this type of modulation. These integrated circuits mostly use phase shift modulators made of a combination of analogue and digital circuitry similar to those used in PWM generators. The generator is based on an analogue sawtooth oscillator. Its output is compared to the control signal that represents the requested phase and then the result is digitally processed to create two pairs of phase shifted signals for each half bridge in a full-bridge converter.

It is a simple method but it has several drawbacks. This type of generator cannot work in the full range of phases. It is difficult to generate phases close to zero and 180 degrees, so the range of allowable phases is narrower, there are some discontinuities at the edges of the range, or both.

A second method of generating phase shift modulation uses a standard analogue or digital PWM controller, wherein the PWM output is converted to phase shift modulated signals. The conversion may be performed by D flip-flop and simple combinatorial logic, for example. However, this method has the same drawback as the first method—the limited range of generated phase because it is difficult to convert PWM with a duty cycle approaching 0 or 100%. The second drawback of both mentioned methods is that they have problems with real time frequency tuning. For example, the frequency of generators based on analogue oscillators is set by passive components, so it is difficult to change in real time. Generators based on a digital PWM modulator have the ability to change the frequency in real time, but the frequency can only be changed in quite large steps. This lack of frequency tuning excludes these methods from being used for controlling resonant converters where smooth tuning of frequency is crucial. Also dead times, that are inserted between switch-off of one transistor and switch-on of the opposite transistor in the half bridge, are generated by analogue circuits. This means that dead times are set by passive components and cannot be changed in real time. Due to all these drawbacks, it is impossible to tune the converter to the optimum performance especially when soft switching at zero voltage and/or current is used.

SUMMARY OF THE INVENTION

Embodiments of the present invention involve a method and apparatus for generating phase shift modulated signals for controlling full-bridge converters. A generator incorporating principles of the present invention is very flexible and many parameters of generated phase shift modulation can be changed in real time. The frequency can be set across a wide range in very fine increments. For example, the phase can be set not only in the range of 0 to 180 degrees, but up to 360 degrees without suffering any discontinuity. This gives a new potential in controlling full-bridge converters. If digital delay lines are used in the generator, dead times can also be changed in real time. All these features make it possible to tune the controlled converter parameters to the optimum even if load, supply voltage, and other factors change in a wide range. Furthermore, substantially all components of the generator may be digital, so the generator can be described in a hardware description language such as VHDL and implemented in a wide range of programmable logical devices or even as an internal peripheral circuit of one or more microcontrollers.

DESCRIPTION OF THE PREFERRED EMBODIMENT

Figure 1:
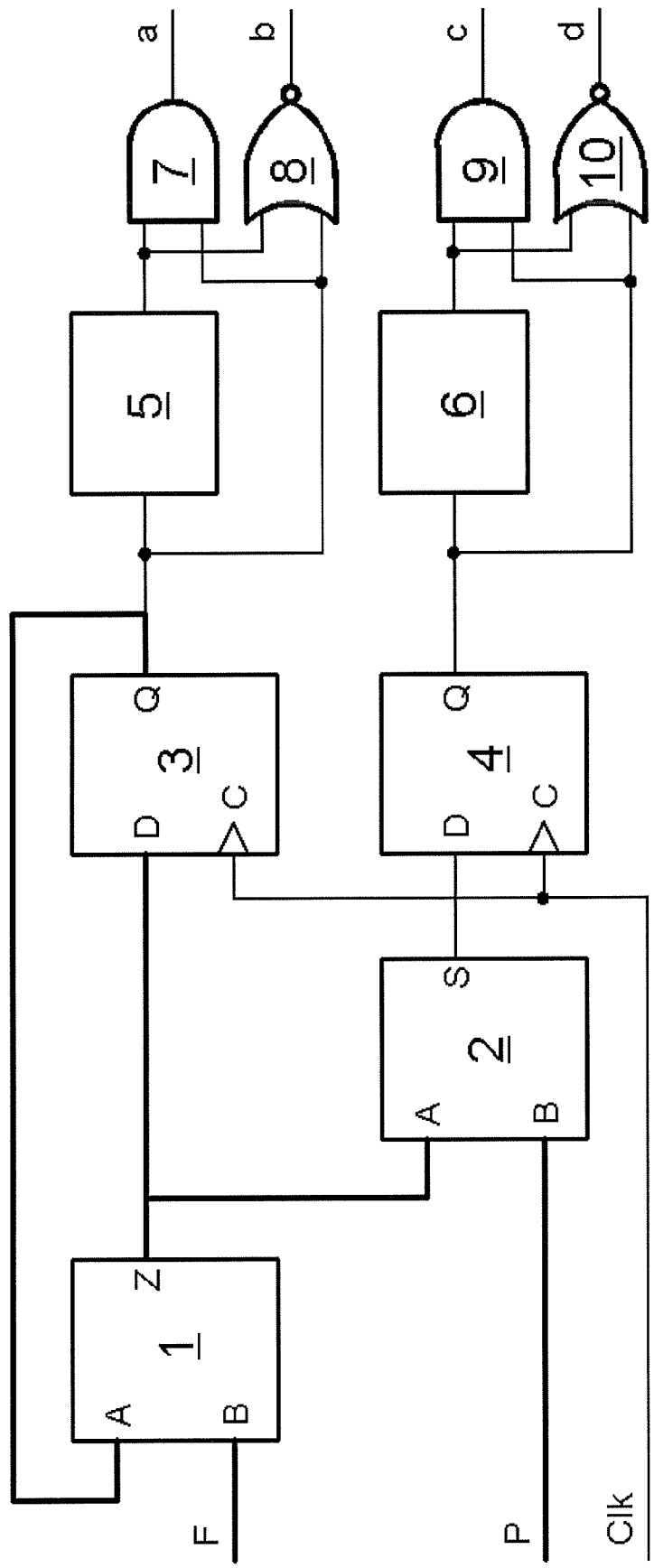
FIG. 1 is a schematic diagram of the generator of phase shift modulation with two adders.

FIG. 1 illustrates a first exemplary phase shift modulation generator including two adders. The generator of FIG. 1 comprises a 32-bit register 3, a 32-bit adder 1, and an 8-bit adder 2. Inputs to the generator include a 24-bit requested frequency value F and an 8-bit requested phase value P. The generator is clocked by a clock signal Clk with a frequency of, for example, 150 kHz. The particular frequency of the clock signal Clk is not critical to the operation of the present invention and may change from one implementation to another. By way of example, the clock signal Clk may be within the range of from a few kilohertz to multiple gigahertz. The frequency value F may be extended to 32 bits by zero-padding upper bits, and is then added to 32-bit output Q of register 3 in adder 1. The frequency value F may be extended to virtually any number of bits to accommodate various implementations of the present invention. By way of example, the frequency value F may be extended to 64 bits, 128 bits, or 256 bits.

Output Z of adder 1 is connected to input D of register 3 and is captured by register 3 on every rising edge of clock signal Clk. Concurrently adder 2 subtracts requested phase value P from the 8 most significant bits of output Z of adder 1. The most significant bit of output S of adder 2 is connected to input D of register 4 and is captured by register 4 on every rising edge of clock signal Clk. The most significant bit of output Q of register 3 is connected to the first inputs of logic gates 7 and 8 and to the input of delay line 5. Delay line 5 sets the dead time for the left half bridge. The output of delay line 5 is connected to the second inputs of logic gates 7 and 8. Output a of logic gate 7 controls the upper transistor in the left half bridge, output b of logic gate 8 controls the lower transistor in the left half bridge.

While logic gate 7 is illustrated as an AND gate and logic gate 8 is illustrated as a NOR gate, it will be appreciated that various different circuits may be used to perform the digital logic represented by logic gates 7 and 8. By way of example, look-up tables, multiplexers, and different configurations of logic gates may be used to perform the same logical operations.

Output Q of register 4 is connected to the first inputs of logic gates 9 and 10 and to the input of delay line 6. Delay line 6 sets the dead time for the right half bridge. The output of delay line 6 is connected to the second inputs of logic gates 9 and 10. Output c of logic gate 9 controls the upper transistor in the right half bridge, output d of logic gate 10 controls the lower transistor in the left half bridge. The parameters of the phase shift modulation generated by the circuit of FIG. 1 are given by the following equations.

The output frequency f of the generated phase shift modulation is:

$$f = \frac{f_{Clk} \cdot F}{2^{N3+1}} = \frac{150 \cdot 10^6 \cdot F}{2^{32}} \doteq 0.0349 \cdot F \ [Hz]$$

The requested frequency value F may be within the range of 0 to (2N1+1−1), or 0 to 16,777,215. Therefore, in the above-described implementation of the present invention the maximum frequency of the generated modulation is:

$$f_{max} = \frac{f_{clk} \cdot (2^{N1+1} - 1)}{2^{N3+1}} = \frac{150 \cdot 10^6 \cdot (2^{24} - 1)}{2^{32}} \doteq 585937 \ [Hz]$$

The output phase j of the generated phase shift modulation is:

$$\varphi = \frac{360 \cdot P}{2^{N2+1}} = \frac{360 \cdot P}{2^8} \doteq 1.4 \cdot P \ [°]$$

Figure 2:
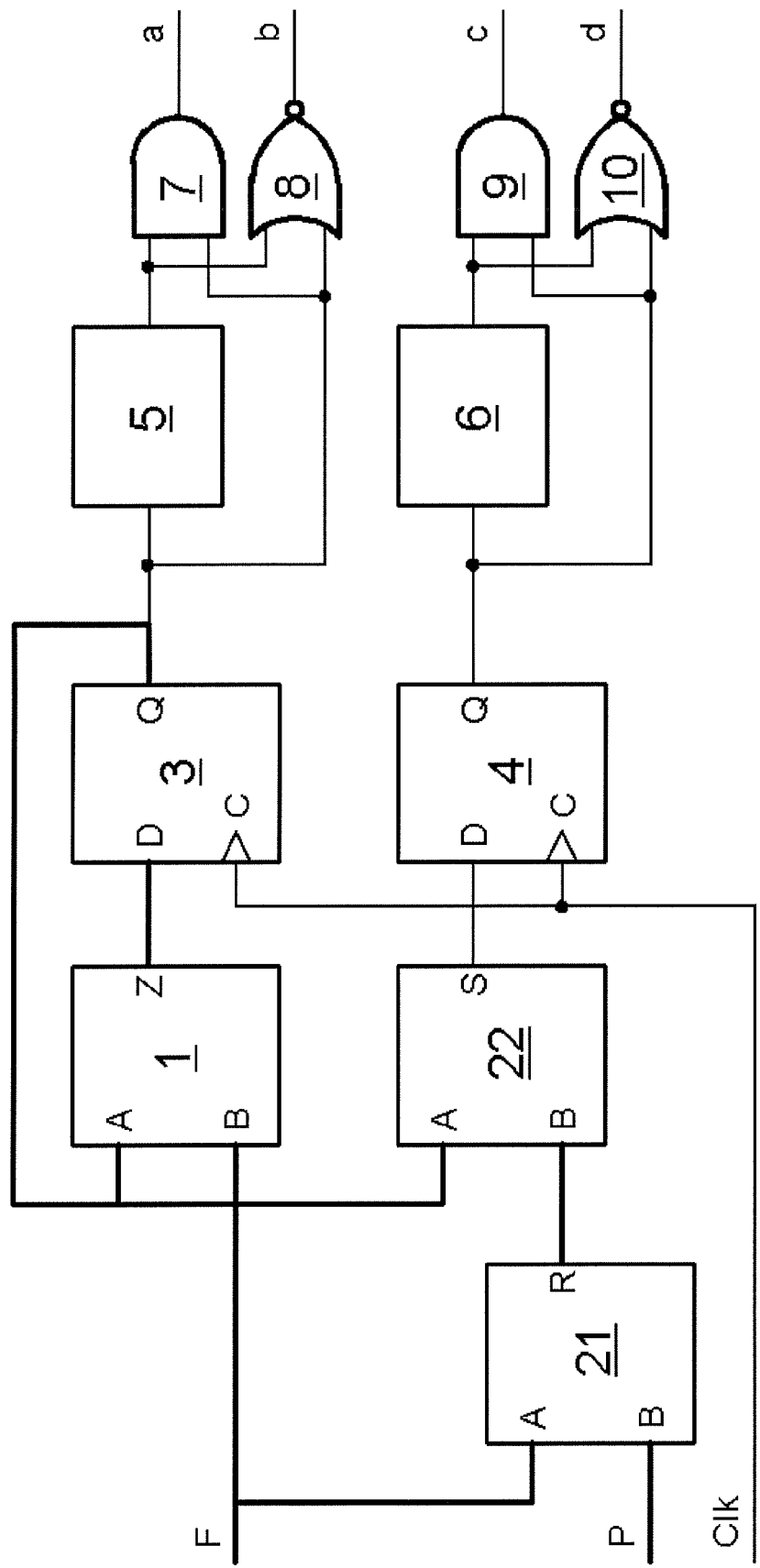
FIG. 2 is a schematic diagram of the generator of phase shift modulation with three adders.

FIG. 2 illustrates a second exemplary phase shift modulation generator including three adders. The generator of FIG. 2 has a 32-bit register 3 and 32-bit adders 1, 21 and 22. Inputs to the generator are a 24-bit requested frequency value F and an 8-bit requested phase value P. The generator is clocked by signal Clk with a frequency of, for example, 150 kHz. The requested frequency value F may be extended to 32 bits by zero-padding upper bits, and is then added to the 32-bit output Q of register 3 in adder 1. Output Z of adder 1 is connected to input D of register 3 and is captured by register 3 on every rising edge of clock signal Clk. Concurrently adder 21 subtracts requested phase value P extended to 32 bits by zero-padding lower bits from requested frequency value F extended to 32 bits by zero-padding upper bits.

Adder 22 adds output R of adder 21 to output Q of register 3. The most significant bit of output S of adder 22 is connected to input D of register 4 and is captured by register 4 on every rising edge of clock signal Clk. The most significant bit of output Q of register 3 is connected to the first inputs of logic gates 7 and 8 and to the input of delay line or element 5. Delay line 5 sets the dead time for the left half bridge. The output of delay line 5 is connected to the second inputs of logic gates 7 and 8. Output a of logic gate 7 controls upper transistor in the left half bridge, output b of logic gate 8 controls the lower transistor in the left half bridge. Output Q of register 4 is connected to the first inputs of logic gates 9 and 10 and to the input of delay line or element 6. Delay line 6 sets the dead time for the right half bridge. The output of delay line 6 is connected to the second inputs of logic gates 9 and 10. Output c of logic gate 9 controls the upper transistor in the right half bridge, output d of logic gate 10 controls the lower transistor in the left half bridge. The parameters of generated phase shift modulation are given by the same equations as in the previous example.

The delay elements 5 and 6 used in both FIG. 1 and FIG. 2 may include analog or digital delay circuits such as, for example, RC circuits, counters, and so forth.

LIST OF SYMBOLS

F—input variable; the frequency of generated phase shift modulation
P—input variable; the phase of generated phase shift modulation
Clk—clock signal with frequency fClk
N1+1—number of bits of variable F
N2+1—number of bits of variable P
N3+1—number of bits of register 3
a—the output for controlling the upper transistor in the left half bridge
b—the output for controlling the lower transistor in the left half bridge
c—the output for controlling the upper transistor in the right half bridge
d—the output for controlling the lower transistor in the right half bridge
tab—dead time for switching transistors in the left half bridge
tcd—dead time for switching transistors in the right half bridge
1—N3+1 bit adder
2—N2+1 bit adder
21—N3+1 bit adder
22—N3+1 bit adder
3—N3+1 bit register
4—1 bit register
5—delay line with tab delay
6—delay line with tcd delay
7, 9—AND logic gates
8, 10—NOR logic gates
A, B—inputs of adders
R, S, Z—outputs of adders
D—register input
Q—register output
C—register clock input

The invention claimed is:

1. A phase shift modulation generator for controlling a full-bridge converter, said generator comprising:

inputs for receiving an N1+1 bit frequency value, an N2+1 bit phase value, and a clock signal;

a first register with an N3+1 bit input and an N3+1 bit output, wherein said first register is clocked by said clock signal;

a second register with an input and an output, wherein said second register is clocked by said clock signal;

a first adder with an N3+1 bit first input, an N3+1 bit second input, and an N3+1 bit output, wherein said first input of said first adder receives said frequency value extended to a length of N3+1 by zero-padding, said second input of said first adder is connected to said output of said first register, and said output of said first adder is connected to said input of said first register;

a second adder with a first input, a second input, and an output, wherein said second adder is configured to subtract a value on said second input from a value on said first input, and wherein N2+1 most significant bits of said output of said first adder are connected to said first input of said second adder, said second input of said second adder receives said phase value; and a most significant bit of said output of said second adder is connected to said input of said second register;

a first delay element with an input and an output, wherein said input of said first delay element is connected to a most significant bit of said output of said first register;

a first logic gate with a first input connected to said output of said first delay element and a second input connected to said most significant bit of said output of said first register;

a second logic gate with a first input connected to said output of said first delay element and a second input connected to said most significant bit of said output of said first register;

a second delay element with an input and an output, wherein said input of said first delay element is connected to a most significant bit of said output of said second register;

a third logic gate with a first input connected to said output of said second delay element and a second input connected to said most significant bit of said output of said second register; and a fourth logic gate with a first input connected to said output of said second delay element and a second input connected to said most significant bit of said output of said second register, wherein an output of said first logic gate controls an upper transistor of a left half bridge of said converter, an output of said second logic gate controls a lower transistor of a left half bridge of said converter, an output of said third logic gate controls an upper transistor of a right half bridge of said converter, and an output of said fourth logic gate controls a lower transistor of a right half bridge of said converter.

2. The generator as set forth in claim 1, wherein said first logic gate is an AND gate.

3. The generator as set forth in claim 2, wherein said second logic gate is a NOR gate.

4. The generator as set forth in claim 3, wherein said third logic gate is an AND gate.

5. The generator as set forth in claim 4, wherein said fourth logic gate is a NOR gate.

6. A phase shift modulation generator for controlling a full-bridge converter, said generator comprising:

inputs for receiving an N1+1 bit frequency value, an N2+1 bit phase value, and a clock signal;

a first register with an N3+1 bit input and an N3+1 bit output, wherein said first register is clocked by said clock signal;

a second register with an input and an output, wherein said second register is clocked by said clock signal;

a first adder with an N3+1 bit first input, an N3+1 bit second input, and an N3+1 bit output, wherein said first input of said first adder receives said frequency value extended to a length of N3+1 by zero padding, said second input of said first adder is connected to said output of said first register, and said output of said first adder is connected to said input of said first register;

a second adder with an N3+1 bit first input, an N3+1 bit second input, and an N3+1 bit output, wherein said second adder is configured to subtract a value on said second input from a value on said first input, and wherein said first input of said second adder receives said frequency value extended to a length of N3+1 by zero padding, said second input of said second adder receives said phase value extended to a length of N3+1 by zero padding;

a third adder with a first input, a second input, and an output, wherein said first input of said third adder receives said output of said first register, said second input of said third adder receives said output of said second adder, and said input of said second register receives a most significant bit of said output of said third adder;

a first delay element with an input and an output, wherein said input of said first delay element is connected to a most significant bit of said output of said first register;

a first logic gate with a first input connected to said output of said first delay element and a second input connected to said most significant bit of said output of said first register;

a second logic gate with a first input connected to said output of said first delay element and a second input connected to said most significant bit of said output of said first register;

a second delay element with an input and an output, wherein said input of said first delay element is connected to a most significant bit of said output of said second register;

a third logic gate with a first input connected to said output of said second delay element and a second input connected to said most significant bit of said output of said second register; and a fourth logic gate with a first input connected to said output of said second delay element and a second input connected to said most significant bit of said output of said second register, wherein an output of said first logic gate controls an upper transistor of a left half bridge of said converter, an output of said second logic gate controls a lower transistor of a left half bridge of said converter, an output of said third logic gate controls an upper transistor of a right half bridge of said converter, and an output of said fourth logic gate controls a lower transistor of a right half bridge of said converter.

7. The generator as set forth in claim 1, wherein said first logic gate is an AND gate.

8. The generator as set forth in claim 2, wherein said second logic gate is a NOR gate.

9. The generator as set forth in claim 3, wherein said third logic gate is an AND gate.

10. The generator as set forth in claim 4, wherein said fourth logic gate is a NOR gate.

* * * * *